(12) United States Patent
Chen et al.

(10) Patent No.: US 6,232,183 B1
(45) Date of Patent: May 15, 2001

(54) METHOD FOR FABRICATING A FLASH MEMORY

(75) Inventors: Hwi-Huang Chen, Hsinchu; Wenchi Ting, Taipei, both of (TW)

(73) Assignee: United Microelectronics Crop., Hsinchu (TW)

( * ) Notice: Subject to any disclaimer, the term of this patent is extended or adjusted under 35 U.S.C. 154(b) by 0 days.

(21) Appl. No.: 09/227,680

(22) Filed: Jan. 8, 1999

(30) Foreign Application Priority Data

Sep. 28, 1998 (TW) .................................................. 87116047

(51) Int. Cl.⁷ .................................................. H01L 21/336
(52) U.S. Cl. .......................... 438/264; 438/257; 438/286; 438/301; 438/303; 438/594
(58) Field of Search ..................................... 438/264, 257, 438/211, 593, 594, 301, 303, 286, 265

(56) References Cited

U.S. PATENT DOCUMENTS

| | | | |
|---|---|---|---|
| 5,345,104 | * 9/1994 | Prall et al. ............................ | 257/607 |
| 5,534,455 | * 7/1996 | Liu ....................................... | 438/263 |
| 5,652,155 | * 7/1997 | Liu et al. .............................. | 438/275 |
| 5,672,531 | * 9/1997 | Gardner et al. ...................... | 438/286 |
| 5,719,425 | * 2/1998 | Akram et al. ........................ | 257/344 |
| 5,783,457 | * 7/1998 | Hsu ...................................... | 438/302 |
| 5,814,864 | * 9/1998 | Liu ....................................... | 257/355 |
| 5,882,970 | * 3/1999 | Lin et al. .............................. | 438/264 |

* cited by examiner

*Primary Examiner*—Michael Trinh
*Assistant Examiner*—Jamie L. Davis
(74) *Attorney, Agent, or Firm*—Jiawei Huang; J.C. Patents

(57) ABSTRACT

A method for fabricating a flash memory is disclosed, in which a stacked gate structure comprising a floating gate and a control gate on the substrate is first formed. Ions are implanted into the substrate at one side of the stacked gate. A drain having a heavily doped region and a lightly doped region are subsequently formed. Spacers one each side of the stacked gate structure are formed. By using a photoresist layer covering the spacer at the drain end, the spacer at the source end can be reduced by an etching process. The source region of the flash memory is formed by implanting ions into the substrate using the reduced spacer as a mask.

13 Claims, 6 Drawing Sheets

METHOD FOR FABRICATING A FLASH MEMORY

CROSS-REFERENCE TO RELATED APPLICATION

This application claims the priority benefit of Taiwan application serial no. 87116047, filed Sep. 28, 1998, the full disclosure of which is incorporated herein by reference.

BACKGROUND OF THE INVENTION

1. Field of the Invention

The present invention generally relates to a method for fabricating an integrated circuit (IC), and more particularly to a method for fabricating a read only memory (ROM).

2. Description of the Related Art

Electrically erasable programmable read only memory (EEPROM) is a widely used device in personal computing equipment. As the name implies, an EEPROM can be erased and reprogrammed electrically without the need for ultraviolet illumination. The EEPROM utilizes a variant of the floating-gate metal oxide semiconductor field effect transistor (MOSFET). Data programmed into the EEPROM will not be lost after the power is turned off. However, the access speed (about 150~200 ns) of the EEPROM is relatively slow, because of larger area required. Recently, a flash memory was developed with a faster access speed of about 70~80 ns to overcome this problem.

A conventional flash memory can be characterized by a two-layer structure comprising a floating gate and a control gate. The floating gate made of polysilicon to store charges is normally in the "floating" state without connecting to any circuitry. On the other hand, the control gate situated on the floating gate to control data access is generally electrically connected to a word line. The above-mentioned two-layer structure comprising the floating gate and the control gate is generally referred to as a stacked gate.

The circuitry layout of a conventional flash memory is shown in FIG. 1, which depicts a portion of a flash memory array. As shown in FIG. 1, the control gate of each flash memory in the same row is electrically connected to the same word line. For example, control gate G of a flash memory 100 is electrically connected to a word line WL2, while a word line WL1 is electrically connected to control gates of another row of flash memories. Sources of the flash memories in the same column are electrically connected to the same bit line. For example, source S of the flash memory 100 is electrically connected to a bit line BL1. Similarly, drains of the flash memories in the same column are electrically connected to another bit line. For example, drain D of the flash memory 100 is electrically connected to a bit line BL2. Note that bit lines electrically connected to sources and drains of a flash memory are different. Generally, the bit lines BL1, BL2, and BL3 are vertically distributed and the word lines WL1 and WL2 are horizontally distributed to jointly form the flash memory array.

FIG. 2 shows a structure layout of a conventional flash memory array. FIGS. 3A through 3C are cross sectional views taken along the line I—I from FIG. 2 showing the processing steps for fabricating a conventional flash memory. FIGS. 4A and 4B are cross sectional views taken along the line II—II from FIG. 2 showing the processing steps for fabricating a conventional flash memory.

Refer first to FIGS. 3A and 4A, in which a substrate 10 is provided, on which a pad oxide layer (not shown) is formed by thermal oxidation. Subsequently, a field oxide layer 14 is formed on the substrate 10 by local oxidation to define an active area. The pad oxide layer is then removed by using a wet etching method. A tunneling oxide layer 12 having a thickness of about 100 Å is formed on the surface of the active area by thermal oxidation. Subsequently, a polysilicon layer having a thickness of about 1500 Å is deposited on the tunneling oxide layer 12 by low pressure chemical vapor deposition (LPCVD). By using photolithography and etching technologies, the polysilicon layer is patterned to form a polysilicon layer 16, which is used as the floating gate of the flash memory.

An inter-poly dielectric layer is deposited by LPCVD covering the polysilicon layer 16. The inter-poly dielectric layer is a three-layer structure made of oxide/nitride/oxide (ONO), and has a thickness of about 250 Å. Subsequently, a polysilicon layer having a thickness of about 3000 Å is deposited on the inter-poly dielectric layer by LPCVD. The polysilicon layer and the inter-poly dielectric layer are then patterned to form a polysilicon layer 20 and an inter-poly dielectric layer 18, respectively, by using the photolithography and etching technologies.

Ions with a higher concentration are subsequently implanted into the substrate 10 to form a doped region 22 by using the polysilicon layer 20 as a mask. To this end, the polysilicon layer 20, the inter-poly dielectric layer 16, and the tunneling oxide layer 12 jointly form a gate electrode of the flash memory transistor.

A mask (not shown) is used to cover portions of the substrate 10 exposing one of the doped regions 22 at one side of the gate electrode. A dopant is implanted in an oblique angle into the substrate 10 by ion implantation. Subsequently, an annealing process is performed to form a tunneling diffusion region 24. The tunneling diffusion region 24 surrounds the doped region 22 and extends to a region below the gate electrode. When the tunneling diffusion region 24 is formed, the mask is removed.

Refer to FIG. 3B, in which an oxide layer is deposited covering the substrate 10 by LPCVD. Subsequently, a spacer 26 is formed on each side of the gate electrode by using an etching back process. The spacer 26 and the gate electrode are used as a mask so that a dopant can be implanted into the substrate 10 by ion implantation to form a doped region 28 as shown in FIG. 3B. At this time, the cross sectional views taken along the line II—II from FIG. 2 is as shown in FIG. 4A.

Refer to FIGS. 3C and 4B, in which a dielectric layer 30 is deposited by LPCVD covering the substrate 10. A contact window 32 is formed in the dielectric layer 30 by using the photolithography and etching processes to expose the doped region 22. A metal layer 34 is deposited on the substrate, filling the contact window 32 to electrically connect to the doped region 22. The metal layer 34 is used as a bit line. Subsequent processes to fabricate the flash memory are well known by those who skilled in the art and are therefore not described herein.

Data can be stored in transistors of the conventional flash memory by using hot electrons and erased by using the Fowler-Nordheim tunneling effect. That is, when data is to be stored on the floating-gate transistor, a large voltage (about 5~6 volts) are applied between the drain and source of the transistor. A large voltage is also applied to the control gate of the transistor, so that the hot electrons flowing out from the source can pass through the tunneling oxide layer near the drain end and trapped within the floating gate layer. The threshold voltage at the floating gate is increased, which implies data is stored. To erase the data stored in the transistor, a positive voltage is applied to the source while a negative voltage is applied to the control gate, so that the trapped electrons within the floating gate are returned to the substrate through the tunneling oxide layer. The floating gate resumes to the state before data is stored.

When integrated circuits demand a higher integration, the channel length under the gate electrode needs to be shorter to increase the operating speed. Unfortunately, the channel length can not be shortened without a limit. Conventional fabricating methods to shorten the channel length depend on alignment technologies during the photolithography process, which imposes constraints to further shorten the channel length and therefore the size of the device.

On the other hand, if the channel length can not be shortened, the doping concentration needs to be higher, which results in a leakage current at the drain or even an electrical breakdown, because of the hot electrons effect. Furthermore, the electrons entering the floating gate from the source will make the programming, reading, and erasing processes out of control.

SUMMARY OF THE INVENTION

It is therefore an objective of the present invention to provide a method for fabricating a flash memory, in which ions are implanted into the source region by using a reduced spacer at the source end, so that the channel length can be shortened.

It is another objective of the present invention to provide a method for fabricating a flash memory where a lower doping concentration is used. When the channel length is shortened, the overlapped area between the drain and gate is not reduced. Thus, the doping concentration can be reduced. Also, a lower doping concentration for ions implanted into the channel for anti-punch through can be used so that the leakage current occurred during the programming and erasing processes can be avoided.

In accordance with the foregoing and other objectives of the present invention, a method for fabricating a flash memory is provided, in which a stacked gate structure comprising a floating gate and a control gate on the substrate is first formed. Ions are implanted into the substrate at one side of the stacked gate. A drain having a heavily doped region and a lightly doped region are subsequently formed. Spacers on each side of the stacked gate structure are formed. By using a photoresist layer covering the spacer at the drain end, the spacer at the source end can be reduced by an etching process. The source region of the flash memory is formed by implanting ions into the substrate using the reduced spacer as a mask.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
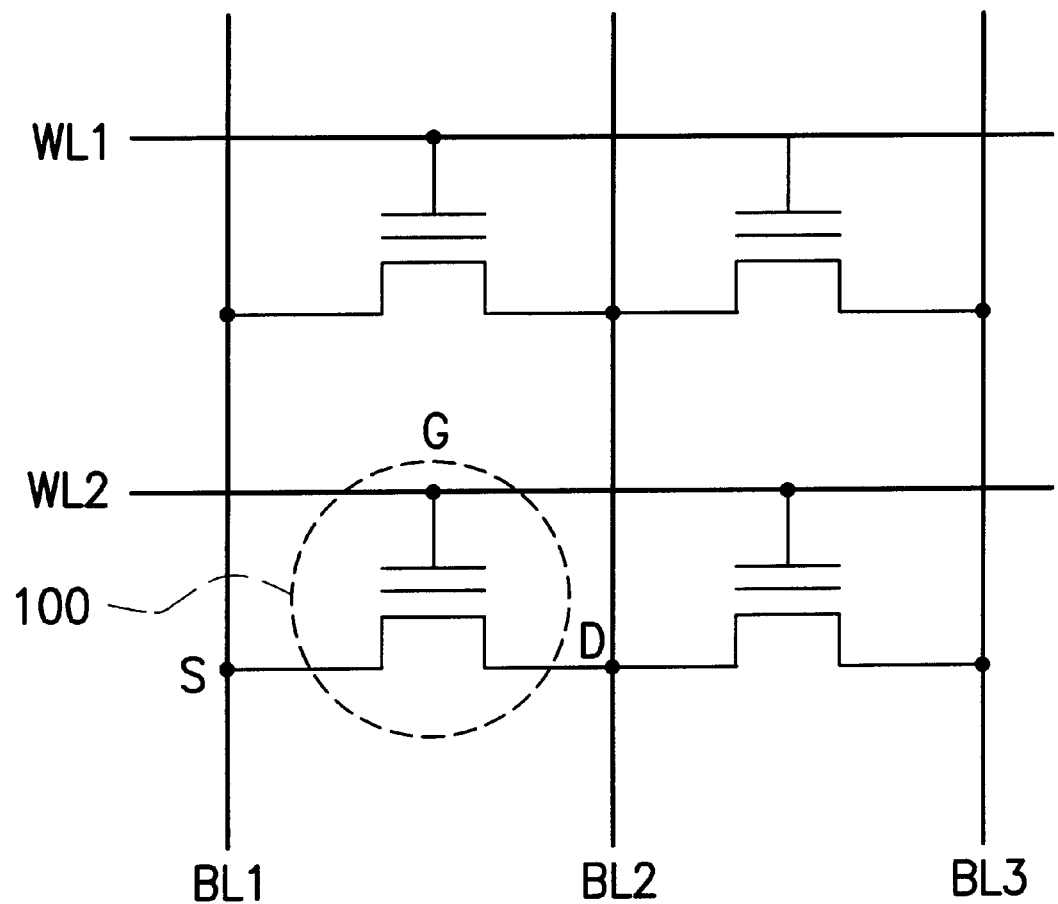
FIG. 1 is a circuitry layout of a conventional flash memory array.
Figure 2:
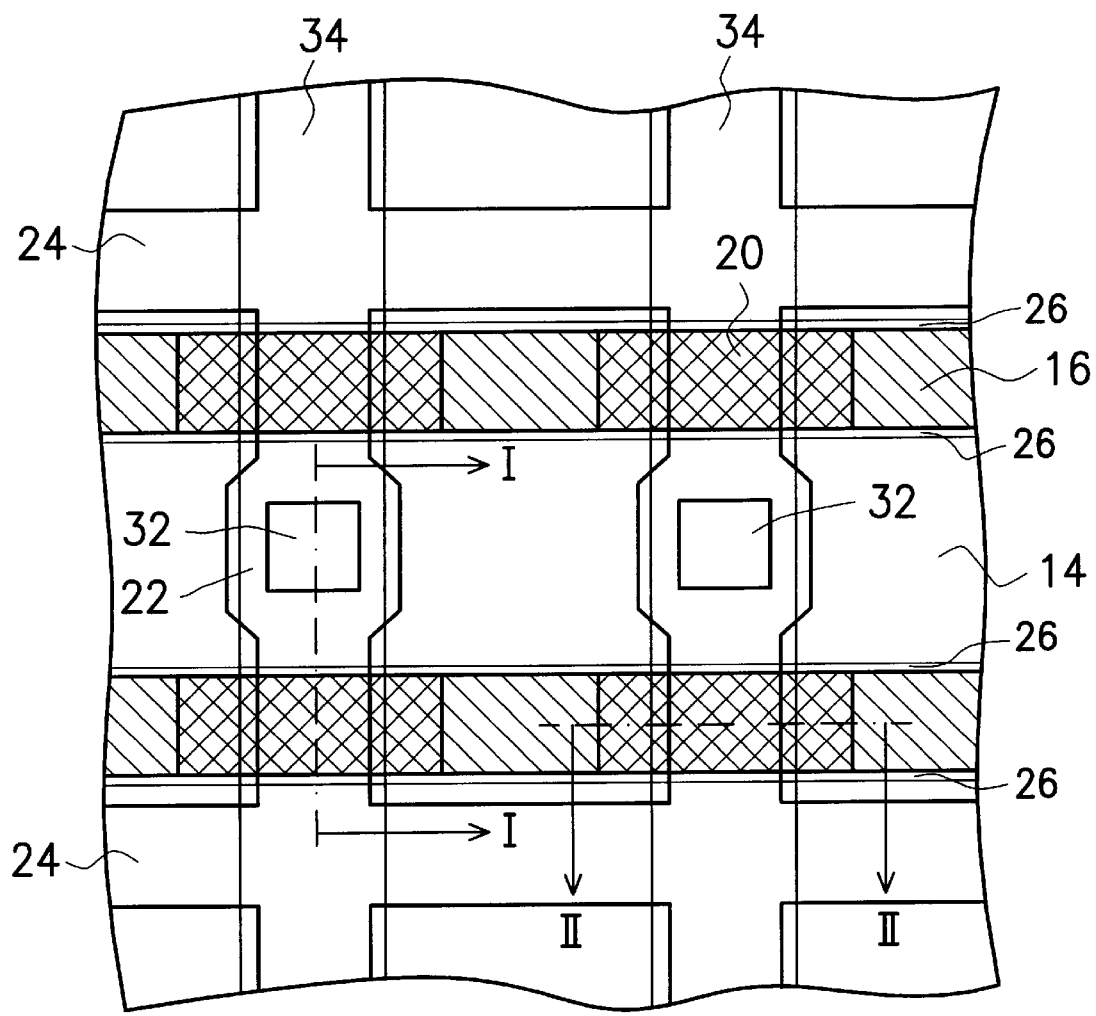
FIG. 2 is a structure layout of a conventional flash memory array.
Figure 3A:
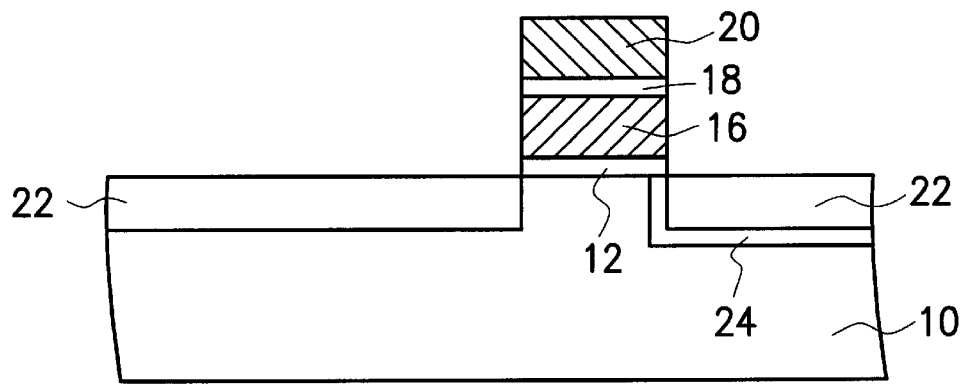
FIGS. 3A through 3C are cross sectional views taken along the line I—I from FIG. 2 showing the processing steps for fabricating a conventional flash memory.
Figure 3B:
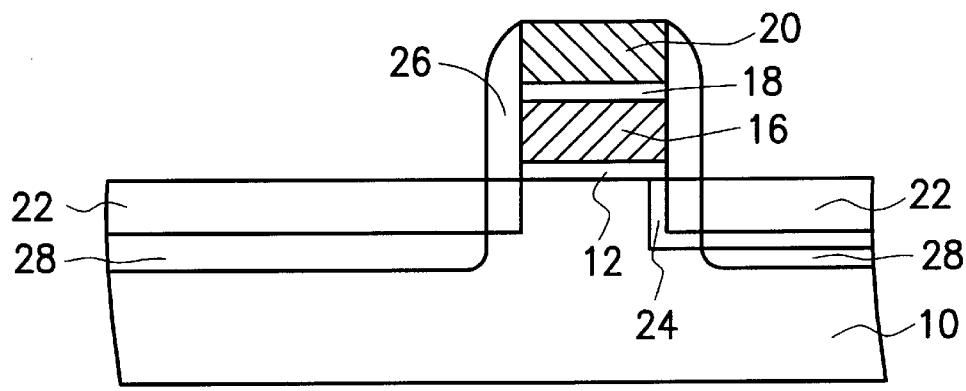
Figure 3C:
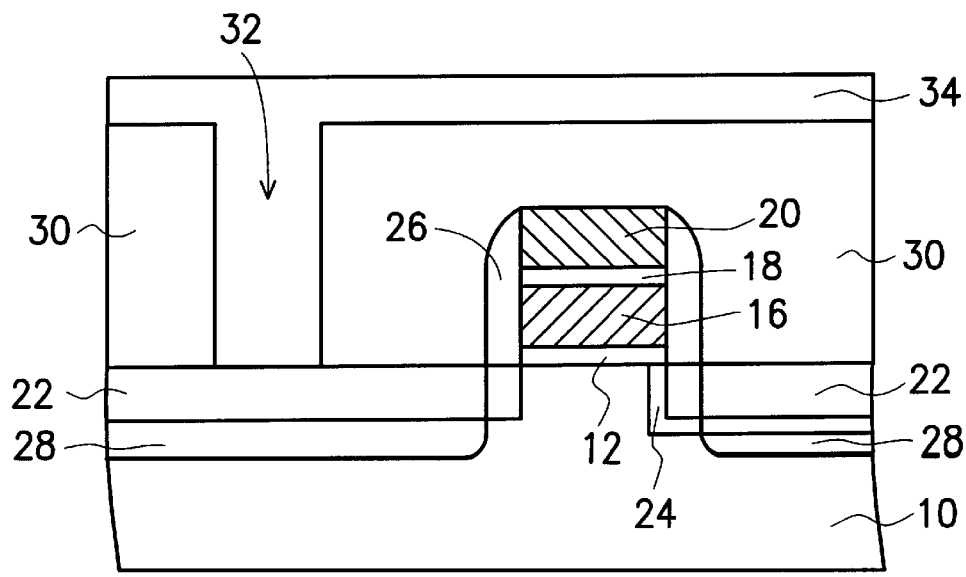
Figure 4A:
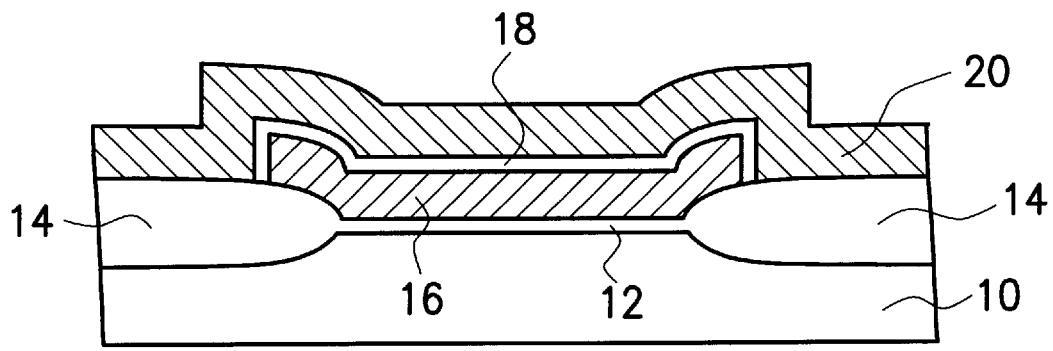
FIGS. 4A and 4B are cross sectional views taken along the line II—II from FIG. 2 showing the processing steps for fabricating a conventional flash memory.
Figure 4B:
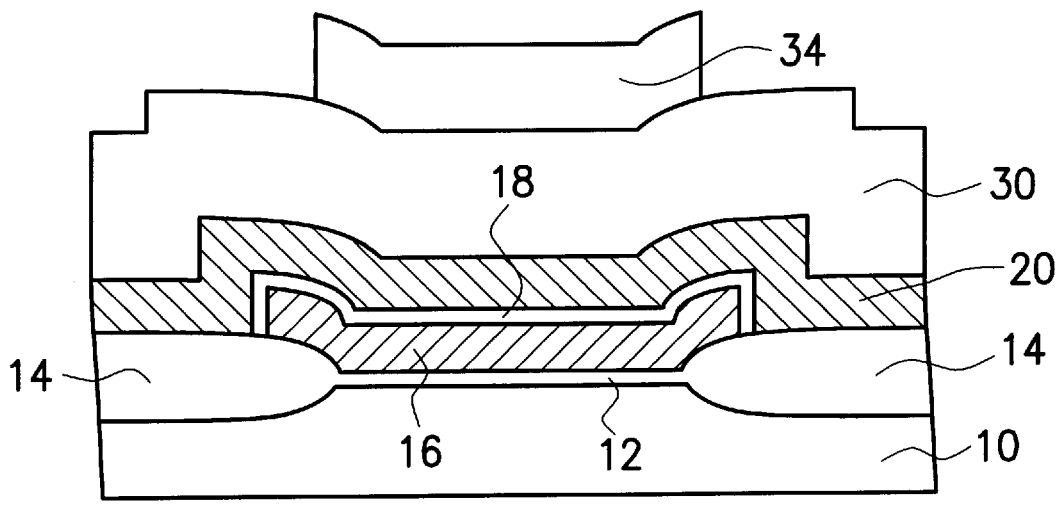

Reference will now be made in detail to the present preferred embodiments of the invention, examples of which are illustrated in the accompanying drawings. Wherever possible, the same reference numbers are used in the drawings and the description to refer to the same or like parts.

Figure 5A:
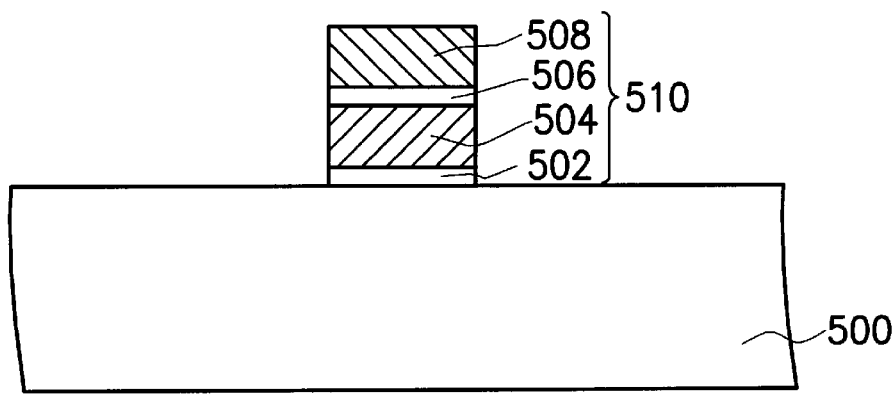
FIGS. 5A through 5E are cross sectional views showing the processing steps for fabricating a flash memory according to one preferred embodiment of the present invention.

Reference is now made to FIG. 5A, where a thin tunneling oxide layer 502 is formed on the provided substrate 500 by thermal oxidation. The tunneling oxide layer 502 generally has a thickness of less than 100 Å and possesses characteristics of, for example, a high dielectric constant, a low oxide layer charge, and high breakdown voltage. A polysilicon layer is deposited on the tunneling layer 502, which is then patterned to form a floating gate 504. The floating gate 504 is covered by a dielectric layer 506 having a multi-level structure of, for example, oxide/nitride/oxide (ONO). Another polysilicon layer is deposited on the dielectric layer 506, which is then patterned to form a control gate 508. To this end, a stacked gate structure 510 of a flash memory is completed.

Figure 5B:
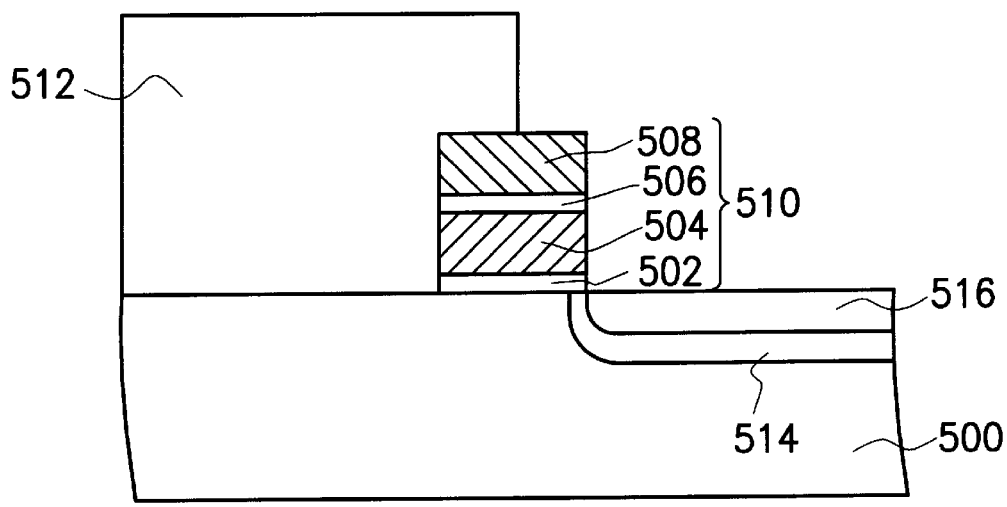

With reference to FIG. 5B, a drain region is defined in the substrate 500, which is described hereinafter. A portion of the substrate 500 is covered by a patterned photoresist layer 512 to expose a region that is to be formed as a drain. The exposed region on the substrate 500 is implanted with ions to form a lightly-doped first doped region 514 and a heavily-doped second doped region 516 at one side of the stacked gate 510. The second doped region 516 covers a smaller area and is located within the first doped region 514. The first doped region 514 and the second doped region 516 have an electrical conductivity type which is opposite to that of the substrate 500. The first doped region 514 and the second doped region 516 jointly form the drain.

Figure 5C:
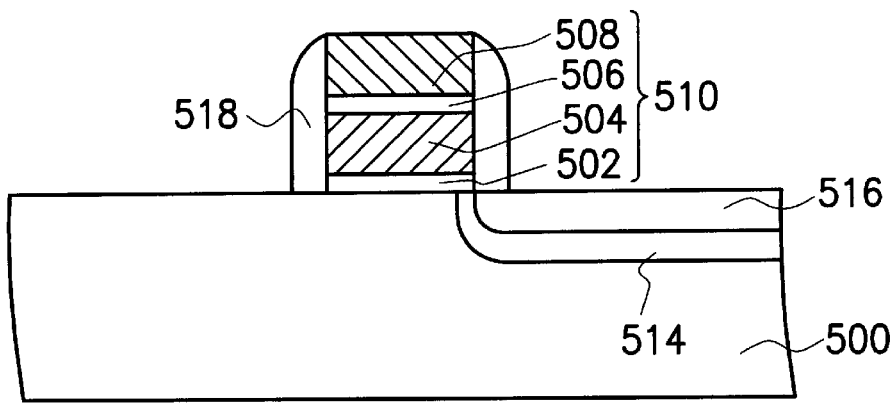

With reference to FIG. 5C, an insulation layer (not shown) is formed to cover the substrate 500 after the photoresist layer 512 is removed. An etching back process or other similar method are used to remove a portion of the insulation layer so as to form spacers on both sides of the stacked gate 510. The spacer 518 is made of, for example, silicon dioxide, silicon nitride, or silicon oxy-nitride.

Figure 5D:
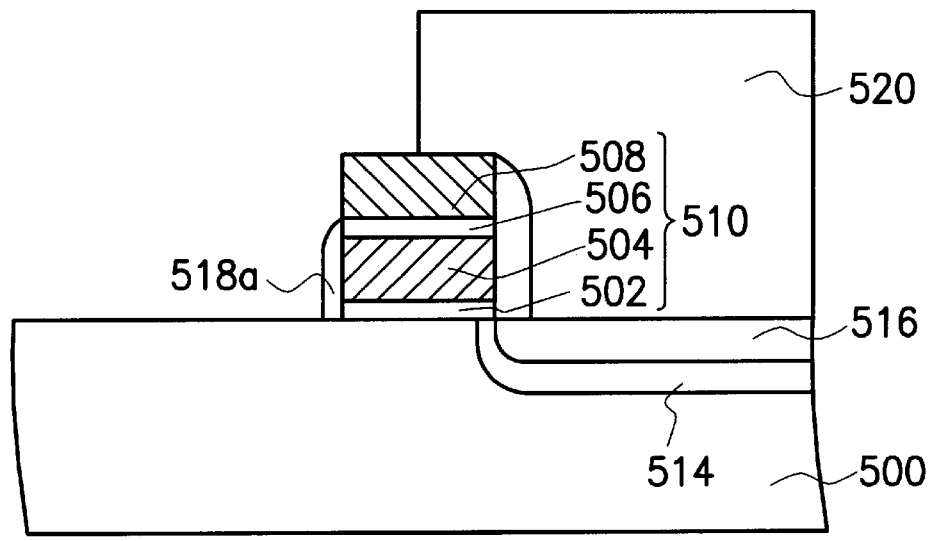

With reference to FIG. 5D, a photoresist layer 520 is formed on the substrate 500 covering a portion of the stacked gate 510 and the drain. A self-align source (SAS) etching process is performed to etch the spacer 518 at the source end to form a reduced spacer 518a.

Figure 5E:
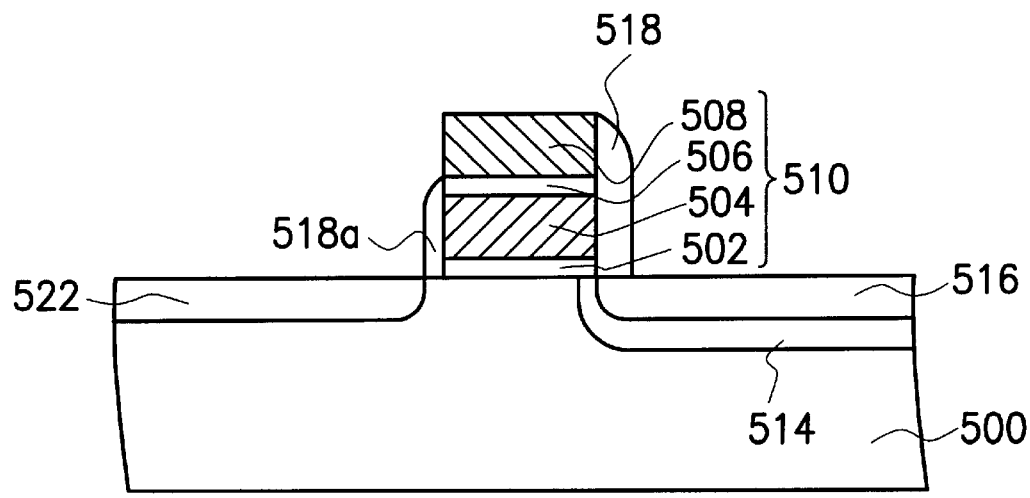

With reference to FIG. 5E, a source region 522 is formed by implanting ions into the substrate 500 using the photoresist layer 520 and the reduced spacer 518a as the mask. The photoresist layer 520 is then removed. The source region 522 has an electrical conductivity type that is the same as that of the first doped region 514 and the second doped region 516 but is opposite to that of the substrate 500.

The programming and erasing procedures of the flash memory according to one preferred embodiment of the present invention are described as follows:

TABLE 1

|  | Control gate | Drain | Source | Substrate |
|---|---|---|---|---|
| Programming | −9~−13 V | 3~6 V | Floating | Grounded |
| Erasing (1) | 18~22 V | Grounded | Grounded | Grounded |
| Erasing (2) | 10~12 V | −10~−12 V | −10~−12 V | −10~−12 V |

To perform a programming procedure, the substrate 500 is grounded and a negative voltage, for example, −10~−12 V, is applied to the control gate 508 of the floating-gate transistor, and a voltage, for example, 3~6 volts, is applied to the drain. Electrons will pass through the tunneling oxide layer 502 from the floating gate 504 to return to the substrate, so as to complete a programming procedure.

To perform an erasing procedure, the source 522, drain, and the substrate 500 are grounded. A voltage, for example, 18~22 volts, is applied to the control gate 508 of the floating-gate transistor. Alternatively, the source 522, the drain, and the substrate 500 are applied with a voltage, for example, −10 volts, and the control gate 508 is applied with a voltage, for example, 10~12 volts, so that electrons can pass through the tunneling oxide layer 502 to reach the floating gate 504. Thus, the erasing procedure is completed.

Since the source region 522 is implanted by using a reduced spacer 518a as a mask, the channel length between the source and the drain is therefore shortened. Once the channel is shortened the doping concentration for both the source and drain region can be reduced, and concentration of ions implanted into the channel for anti-punch through can also be reduced. Because of the lowered doping concentration used, the resulting leakage current can be avoided when the voltage at the drain is reduced.

It is therefore a characteristic of the present invention to provide a method for fabricating a flash memory, in which a self-align source (SAS) etching process is performed to form a reduced spacer at the source end. By implanting ions into the substrate to form a source region by using a reduced spacer as a mask, the channel length can be shortened. When the channel length is shortened, the concentration for ions implanted into the source and drain and ions implanted into the channel for anti-punch through can also be reduced. Hence, the leakage current in the drain when the floating gate transistor is in operation can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory which includes a substrate, a stacked gate formed on the substrate, a spacer formed on each side of the stacked gate, and a drain formed in the substrate at one side of the stacked gate, the method comprising the steps of:

forming a photoresist layer on the substrate covering the drain and a portion of the stacked gate;

reducing the spacer which is uncovered by the photoresist layer;

forming a source in the substrate at one side of the stacked gate by using the reduced spacer as a mask, wherein the source is only doped once; and removing the photoresist layer.

2. The method of claim 1, wherein the spacer is silicon dioxide.

3. The method of claim 1, wherein the spacer is silicon oxy-nitride.

4. The method of claim 1, wherein the spacer is silicon nitride.

5. The method of claim 1, wherein the drain further comprises:

a first doped region formed in the substrate; and a second doped region formed in the first doped region.

6. The method of claim 5, wherein the first doped region has a lower doping concentration than the second doped region.

7. The method of claim 5, wherein the first doped region and the second doped region have the same electrical conductivity type, which is opposite to that of the substrate.

8. The method of claim 1, wherein the source has an electrical conductivity type, which is opposite to that of the substrate.

9. A method of fabricating a flash memory, comprising the steps of:

providing a substrate, on which a tunneling oxide layer, a stacked gate comprising a floating gate, a dielectric layer, and a control gate are formed;

forming a drain having a first doped region and a second doped region in the substrate at one side of the stacked gate;

forming a spacer on each side of the stacked gate;

forming a photoresist layer on the substrate covering the drain and a portion of the stacked gate;

reducing the spacer which is uncovered by the photoresist layer on one side of the stacked gate;

forming a source in the substrate by using the reduced spacer as a mask, wherein the source is only doped once; and removing the photoresist.

10. The method of claim 9, wherein the spacer is formed of silicon dioxide.

11. The method of claim 9, wherein the spacer is formed of silicon oxy-nitride.

12. The method of claim 9, wherein the spacer is formed of silicon nitride.

13. The method of claim 9, wherein the second doped region located within the first doped region and the first doped region has a lower doping concentration than that of the second doped region.

* * * * *